United States Patent
Lee et al.

(10) Patent No.: US 8,804,349 B2
(45) Date of Patent: Aug. 12, 2014

(54) FOLDABLE DISPLAY DEVICE

(71) Applicant: Samsung Display Co., Ltd., Yongin (KR)

(72) Inventors: Sang-Wol Lee, Yongin (KR); In-Seo Kee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/053,506

(22) Filed: Oct. 14, 2013

(65) Prior Publication Data

US 2014/0111954 A1 Apr. 24, 2014

(30) Foreign Application Priority Data

Oct. 19, 2012 (KR) .......... 10-2012-0116532
Jan. 23, 2013 (KR) .......... 10-2013-0007548

(51) Int. Cl.
*H05K 1/00* (2006.01)

(52) U.S. Cl.
USPC .. 361/749; 361/748; 361/679.01; 361/679.08

(58) Field of Classification Search
USPC .......... 361/749, 748, 679.01, 679.08
See application file for complete search history.

(56) References Cited

U.S. PATENT DOCUMENTS

2012/0314399 A1* 12/2012 Bohn et al. .......... 362/97.1
2013/0016460 A1* 1/2013 Yeh et al. .......... 361/679.01

FOREIGN PATENT DOCUMENTS

| KR | 10-2012-0002084 A | 1/2012 |
| KR | 10-2012-0048853 A | 5/2012 |
| KR | 10-2012-0049762 A | 5/2012 |

* cited by examiner

*Primary Examiner* — Andargie M Aychillhum
(74) *Attorney, Agent, or Firm* — Knobbe, Martens, Olson & Bear, LLP

(57) ABSTRACT

A foldable display device including a case that stably supports a flexible display panel for improving user convenience is disclosed. In one aspect, the foldable display device includes a flexible display panel including a foldable area between lateral plane areas thereof and a pair of front cases surrounding a front perimeter of the flexible display panel. The device also includes a pair of bottom cases coupled with the pair of front cases to house the flexible display panel and a biaxial hinge member mounted to the bottom case in the foldable area to connect the pair of front cases to respective rotation points.

17 Claims, 8 Drawing Sheets

FOLDABLE DISPLAY DEVICE

CROSS-REFERENCE TO RELATED APPLICATIONS

This application claims priority to and the benefit of Korean Patent Application Nos. 10-2012-0116532 and 10-2013-0007548 filed in the Korean Intellectual Property Office on Oct. 19, 2012, and Jan. 23, 2013, the entire contents of which are incorporated herein by reference.

BACKGROUND

1. Field

The described technology generally relates to a foldable display device that can be unfolded and folded.

2. Description of the Related Technology

Foldable display devices typically use a bendable and flexible display. The foldable display device can be portable while folded and will have a relatively large screen than the portable dimensions belie while unfolded. Therefore, foldable display devices can be used not only as mobile equipment such as mobile phones, ultra-mobile PCs, electronic books, and the like but can also be embodied in various other applications including as a television, a computer monitor, and the like.

Foldable display devices are generally provided with a case which supports the flexible display panel. The case is typically formed to support a bottom side of the flexible display panel, having a folded area between lateral plane areas thereof. For example, the case includes a plane portion corresponding to the lateral plane areas and a convex curved portion corresponding to the folded area and connected to the lateral plane portions by a hinge.

When the foldable display device is folded, the curved portion becomes convex and surrounds the folded area of the flexible display panel to support the flexible display panel. However, when the foldable display device is unfolded, the curved portion has a convex protrusion on the opposite side of the flexible display panel.

Thus, when the foldable display device is unfolded, the externally convex curved portion protrudes away from the display panel, and thus, cannot support the flat folded area. That is, the folded area and the curved portion of the flexible display panel maintain a separation from each other, and accordingly, the convenience to the user can be adversely impacted.

The above information disclosed in this Background section is only intended to facilitate the understanding of the background of the described technology and therefore it may contain information that does not constitute the prior art that is already known in this country to a person of ordinary skill in the art.

SUMMARY OF CERTAIN INVENTIVE ASPECTS

One inventive aspect is a foldable display device including a case which can stably support a flexible display panel, thereby improving the convenience of the device to a user.

Another aspect is a foldable display device including: a flexible display panel including a folded area between lateral plane areas thereof; a pair of front cases surrounding a front circumference of the flexible display panel; a pair of bottom cases coupled with the pair of front cases to house the flexible display panel; and a biaxial hinge member mounted to the bottom case in the folded area to connect the pair of front cases to respective rotation points.

Each of the bottom cases includes a lateral plane portion corresponding to the plane areas and the foldable display device further comprises a curved portion connecting the lateral plane portions in an area corresponding to the folded area.

The curved portion may include two half-curved portions respectively connected to the lateral plane portions and the two half-curved portions may be connected through a hinge portion so as to be folded or unfolded.

The biaxial hinge member may include a body disposed in an outer side of the bottom case, an installation portion formed in an inner side of the body and installed in the hinge portion, and a connection portion coupled to a hole of the body by a hinge at a distance from the installation portion and connected to the pair of front cases.

Another aspect is a display device including a pair of supports disposed between the flexible display panel and the bottom case in the plane areas and supporting the flexible display panel by being mounted to the pair of front cases by a pair of hinges.

The biaxial hinge member may further include a control piece formed in one side of the connection portion in an inner side of the body to closely attach the pair of supports to the flexible display panel.

The two half-curved portions may further include first curved protrusion portions formed protruding from ends of the two half-curved portions to house the control piece.

The pair of front cases may further include second curved protrusion portions formed protruding from ends of the pair of front cases corresponding to the first curved protrusion portions to house the first curved protrusion portions and the control piece.

The first curved protrusion portions and the second curved protrusion portions may be formed on the inside of the external sides of the front and bottom cases and may be recessed by as at least the sum of the thickness of the body and the thickness of the connection portion.

The foldable display device may further include a first support and a second support provided between the flexible display panel and the bottom case to support the flexible display panel in the plane areas.

The first support may be mounted to a first front case of the pair of front cases with a hinge, and the second support may be mounted to a sliding member with a hinge by providing the sliding member to a second bottom case of the bottom cases.

The second bottom case may be provided with a rail that guides movement of the sliding member and the sliding member may be coupled to the rail and connected to an actuator The second bottom case may be provided with a support protruding from the second bottom case, and the actuator may be formed as a spring member inserted between the sliding member and the support portion.

Another aspect is a foldable display device including: a flexible display panel having a folded area between lateral plane areas; a case housing the flexible display panel; a biaxial hinge member connecting the case to rotation portions in the folded area; and a support disposed in the case in the plane area to support the flexible display panel by being mounted to the case by a hinge.

The biaxial hinge member may include a control piece supporting the end of the support in the folded area to closely attach the support to the flexible display panel.

The support may include a first support and a second support that support the flexible display panel, the first support may be mounted to one side of the case with a hinge, and the second support may be mounted to a sliding member with a hinge by providing the sliding member in the other side of the case.

DETAILED DESCRIPTION OF CERTAIN INVENTIVE EMBODIMENTS

The described technology will be described more fully hereinafter with reference to the accompanying drawings, in which exemplary embodiments are shown. As those skilled in the art would realize, the described embodiments may be modified in various different ways, all without departing from the spirit or scope of the described technology.

The drawings and description are to be regarded as illustrative in nature and not restrictive. Like reference numerals designate like elements throughout the specification. In addition, the size and thickness of each component shown in the drawings are shown only to facilitate understanding and ease of description, but the described technology is not limited thereto.

In the drawings, the thickness of layers, films, panels, regions, etc., may be exaggerated for clarity. In the drawings, to facilitate understanding and ease of description, the thickness of some layers and areas may be exaggerated. It will be understood that when an element such as a layer, film, region, or substrate is referred to as being "on" another element, it can be directly on the other element or intervening elements may also be present.

Figure 1:
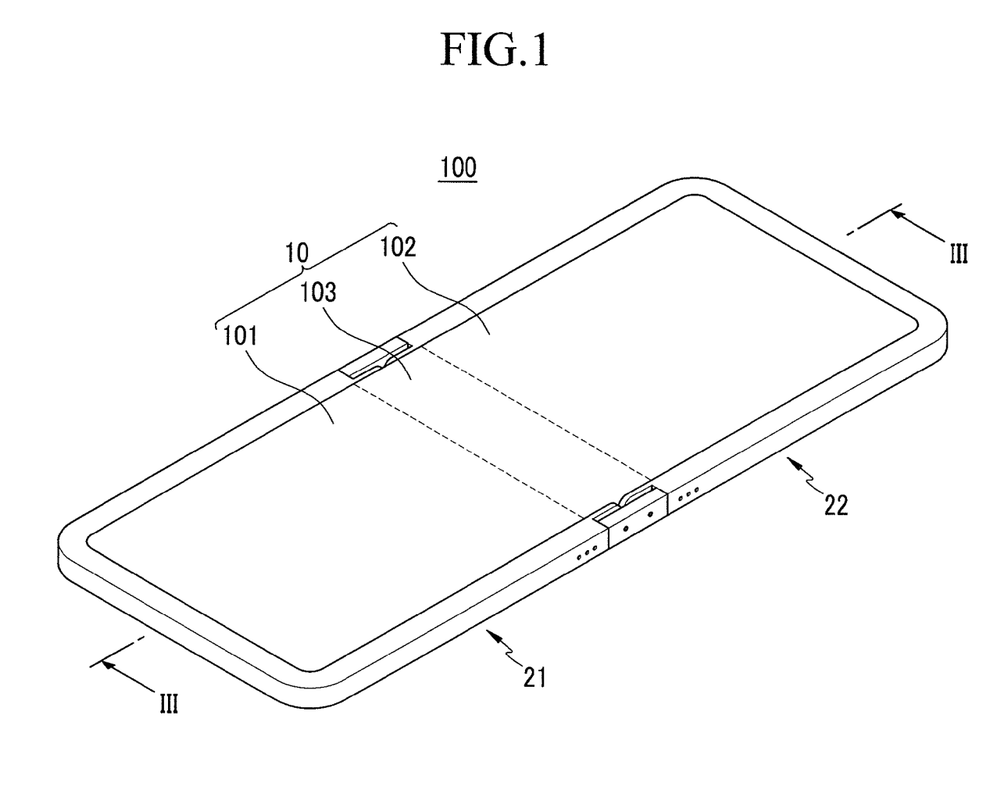
FIG. 1 is a perspective view of a foldable display device according to an exemplary embodiment.
Figure 2:
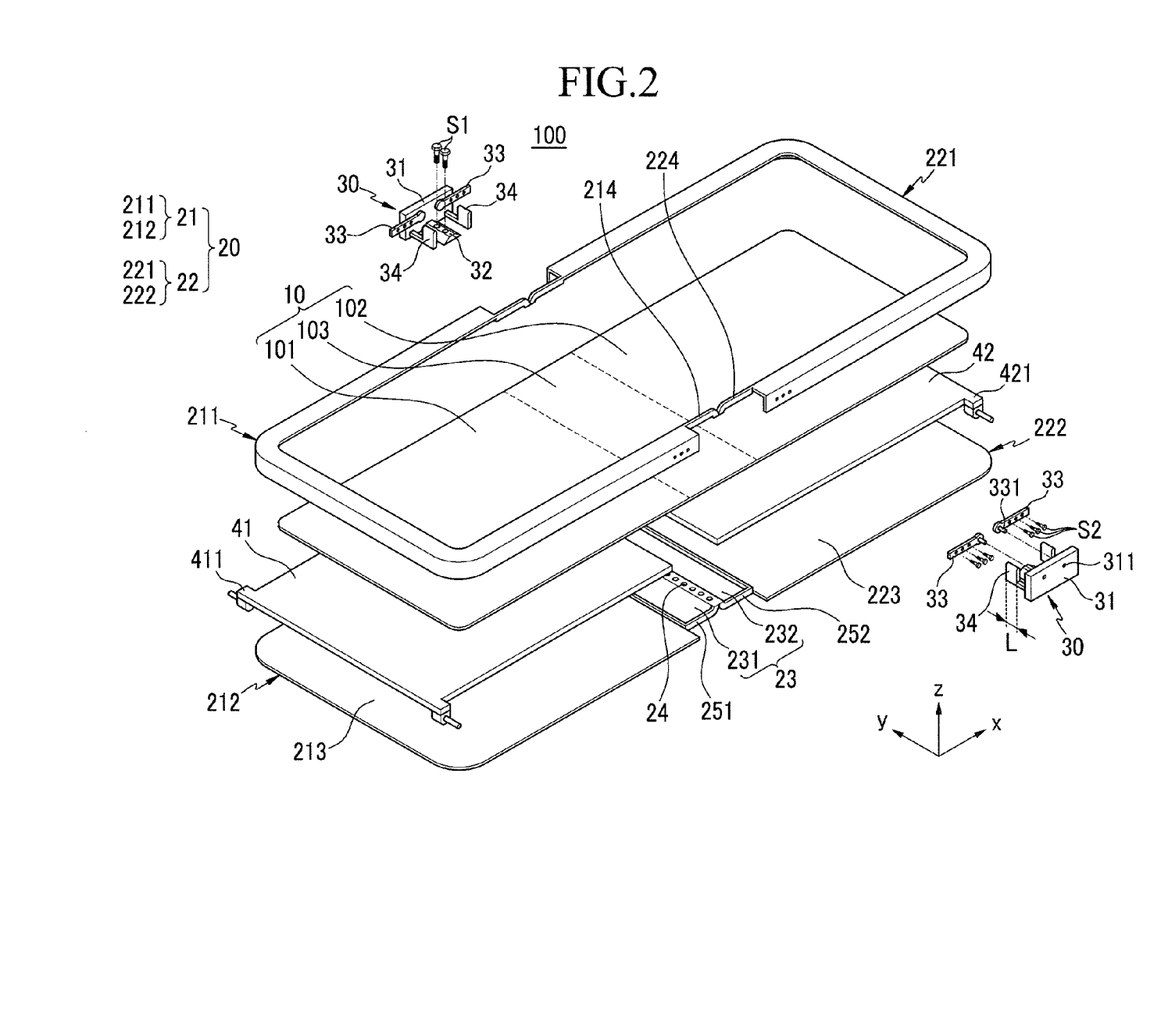
FIG. 2 is an exploded perspective view of the foldable display device of FIG. 1.

FIG. 1 is a perspective view of a foldable display device according to an exemplary embodiment and FIG. 2 is an exploded perspective view of the foldable display device of FIG. 1. Referring to FIG. 1 and FIG. 2, a foldable display device 100 according to an exemplary embodiment includes a flexible display panel 10, a case 20 housing the flexible display panel 10, and a biaxial hinge member 30 connecting lower and upper portions of the case 20.

In some embodiments, the flexible display panel 10 includes a flexible film such as a plastic film, and displays an image using an organic light-emitting diode (OLED) and a pixel circuit arranged on the flexible film. A detailed structure of the flexible display panel 10 will be described later.

A cover window (not shown) is provided on the outside of the flexible display panel 10 where an image is displayed. The cover window can be formed of a transparent hard material to transmit the image of the flexible display panel 10 and to protect the flexible display panel 10 against external impact.

A touch panel (not shown) that senses the touching operation of a user may be disposed between the flexible display panel 10 and the cover window. The flexible display panel 10, the touch panel, and the cover window form a display module. Thus, in the present exemplary embodiment, the flexible display panel 10 can include a display module.

In the foldable display device 100, the flexible display panel 10 includes plane areas 101 and 102 provided at both sides thereof and a foldable area (hereinafter to be interchangeably used with a folded area) 103 formed between the plane areas 101 and 102.

The case 20 includes a first case 21 and a second case 22 respectively corresponding to the one side plane area 101 and the other side plane area 102. The first and second cases 21 and 22 are coupled in the foldable area 103 to house the flexible display panel 10.

The first case 21 houses the one side plane area 101 and the second case 22 houses the other side plane area 102. The rotation points of each of the first and second cases 21 and 22 are connected to each other in the foldable area 103 by the biaxial hinge member 30.

In addition, the first case 21 includes a first front case 211 and a first bottom case 212. The first front case 211 surrounds substantially the entire circumference (or perimeter) of the plane area 101 of the flexible display panel 10, and the first bottom case 212 is coupled to the first front case 211 to house the plane area 101.

The second case 22 includes a second front case 221 and a second bottom case 222. The second front case 221 surrounds the entire circumference of the plane area 102 of the flexible display panel 10, and the second bottom case 222 is coupled to the second front case 221 to house the plane area 102.

The biaxial hinge members 30 are arranged corresponding to lateral sides of the foldable area 103 of the flexible display panel 10, and one side biaxial hinge member 30 is mounted to the first and second bottom cases 212 and 222 and the other side biaxial hinge member 30 is connected to the respective rotation points of the first and second front cases 211 and 221.

For example, the first and second bottom cases 212 and 222 include plane portions 213 and 223 formed in lateral sides to correspond to the plane areas 101 and 102 and a curved portion 23 connects the plane portions 213 and 223.

The curved portion 23 is connected to the plane portions 213 and 223, and is partitioned into two half-curved portions 231 and 232. The two half-curved portions 231 and 232 are connected to a hinge portion 24 in order to be folded or unfolded.

When the foldable display device 100 is unfolded, the plane areas 101 and 102 of the flexible display panel 10 are supported by the plane portions 213 and 223 of the first and second bottom substrates 212 and 222, and simultaneously the foldable area 103 is unfolded and thus supported by the hinge portion 24.

The biaxial hinge member 30 includes bodies 31, installation portions 32 installed in the first and second bottom cases 212 and 222 and connection portions 33 connected to the first and second front cases 211 and 221. Alternatively, the connection portions 33 may be connected to the first and second bottom bases 212 and 222. The connection portions 33 may also be connected to both of the front cases 211 and 221 and the bottom cases 212 and 222.

In some embodiments, the bodies 31 are disposed in external sides of the first and second bottom cases 212 and 222, and the installation portions 32 are protruded into the bodies 31 and installed to the hinge portion 24 by screws S1. The installation portions 32 are disposed in the outer sides of the hinge portion 24 and fixed by the screws S1. The connection portions 33 are separated from the installation portion 32 and rotatably coupled to holes 311 of the bodies 31 by a hinge 331, and inserted into the first and second front cases 211 and 221 and thus connected by screws S2. The connection portions 33 rotate around the external circumference of the hinge 331 in the shape of a circle.

The foldable display device 100 may further include a first support 41 and a second support 42 supporting the flexible display panel 10 in the folded or unfolded state. The first and second supports 41 and 42 can further stably support the flexible display panel 10 in the display device 100.

For example, the first support 41 is disposed between the flexible display panel 10 and the first bottom case 212 and rotatably mounted to the first front case 211 by a hinge 411 in the plane area 101.

The second support 42 is disposed between the flexible display panel 10 and the second bottom case 222 and rotatably mounted to the second front case 221 by a hinge 421 in the plane area 102.

Thus, when the foldable display device 100 is unfolded, the first and second supports 41 and 42 respectively support the flexible display panel 10 while respectively turning with respect to the hinges 411 and 421.

As described, opposite ends of the hinges 411 and 421 of the first and second supports 41 and 42 should be supported to stabilize operation of the first and second supports 41 and 42 that support the flexible display panel 10 while turning.

For this purpose, the biaxial hinge member 30 may be provided with a control piece 34. The control piece 34 is formed in one side of the connection portion in an inner side of the body 31 to closely attach the first and second supports 41 and 42 to the flexible display panel 10. In addition, an end of the control piece 34 is curved along the rotation direction of the first and second supports 41 and 42 to minimize friction from contact when rotating with the first and second supports 41 and 42.

The control piece 34 has a step structure to prevent interruption of the rotation of the connection portion 33 in an inner side of the body 31, and has a length L set along a width direction (i.e., y-axis direction of FIG. 2) of the first and second supports 41 and 42 outside of the rotation area of the connection portion 33.

The half-curved portions 231 and 232 of the first and second bottom cases 212 and 222 further comprise first curved protrusion portions 251 and 252 protruding from the ends thereof. The first curved protrusion portions 251 and 252 house the control piece 34 that rotatably supports the circular circumference of the connection portion 33 in the hinge 331 side in the inner side of the half-curved portions 231 and 232.

The first and second front cases 211 and 221 further include second curved protrusion portions 214 and 224 formed protruding from the ends of the first and second front cases 211 and 221 to correspond to the first curved protrusion portions 251 and 252. The second curved protruding portions 214 and 224 house the first curved protrusion portions 251 and 252 and the control piece 34. This configuration supports the rotation of the connection portion 33 around the hinge 331 in the inner side of the half-curved portions 231 and 232.

The first curved protruding portions 251 and 252 and the second curved protruding portions 214 and 224 are formed on the inside of the external sides of the front and bottom cases (i.e., inside of the front and bottom cases in the y-axis direction). The first and second curved protruding portions 251, 252, 214 and 224 may be recessed from the outside by at least the sum of the thickness of the body and the thickness of the connection portions 33.

Figure 3:
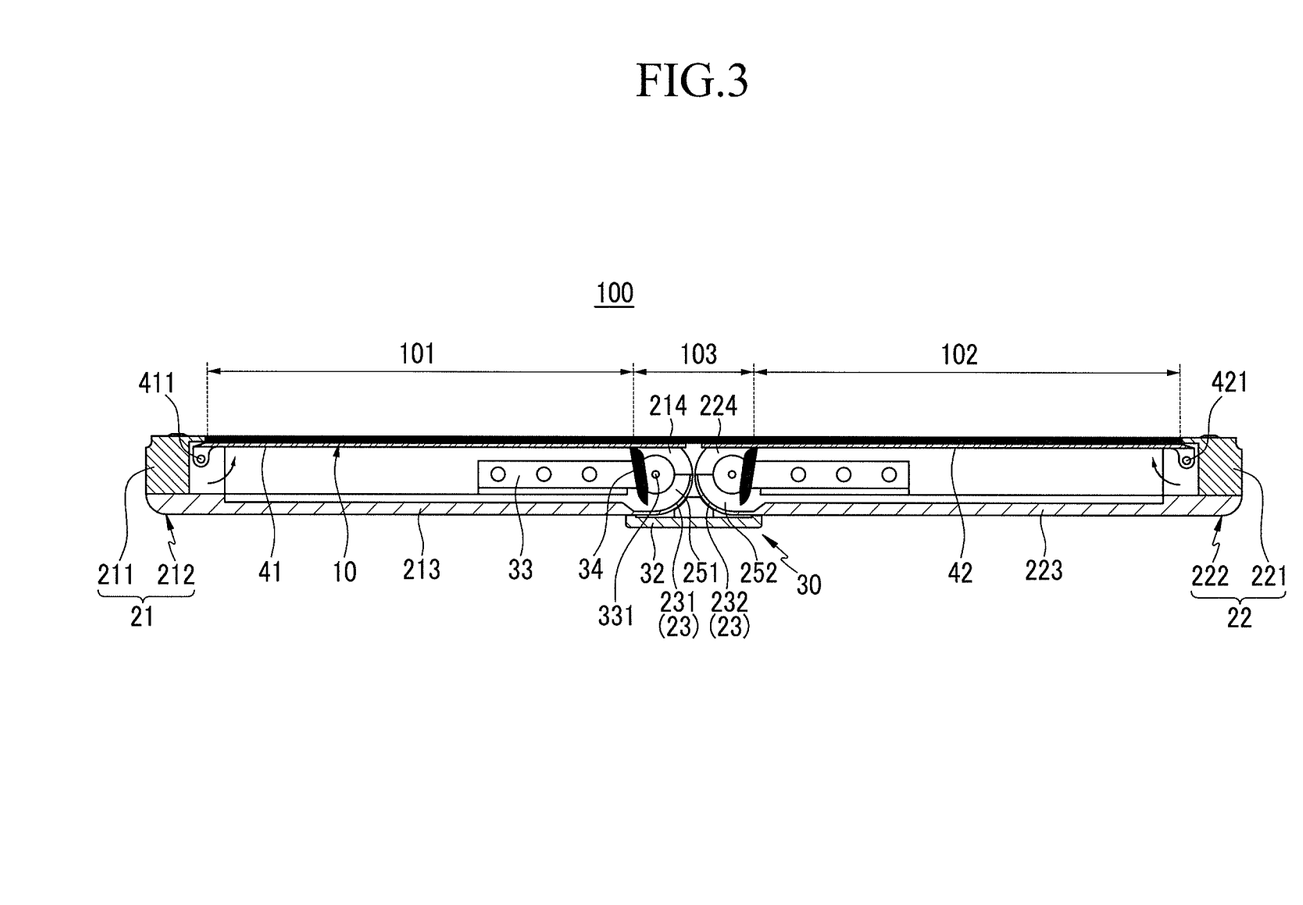
FIG. 3 is a cross-sectional view of the foldable display device of FIG. 1, taken along the line III-III.
Figure 4:
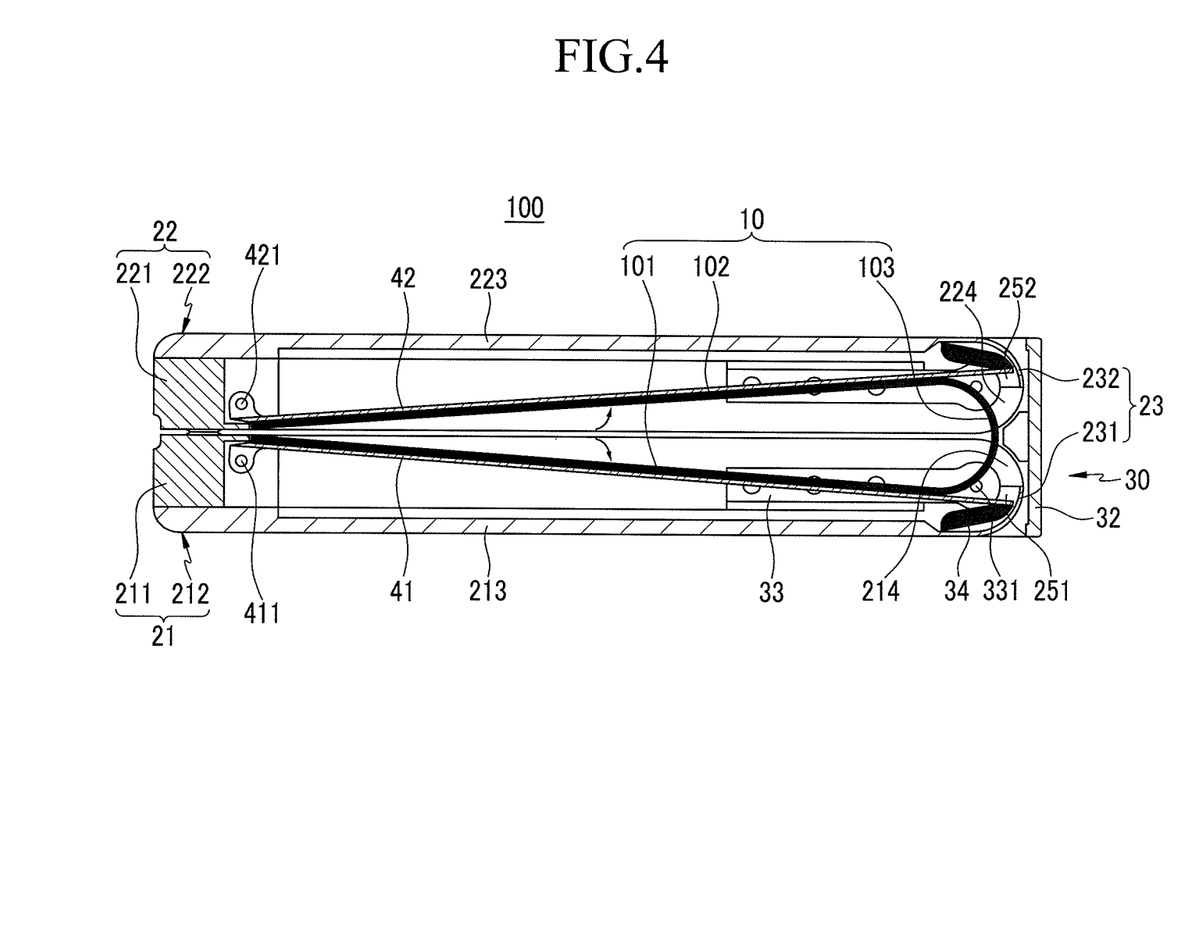
FIG. 4 is a cross-sectional view of the foldable display device of FIG. 3, in the folded state.

FIG. 3 is a cross-sectional view of the foldable display device of FIG. 1, taken along the line III-III and FIG. 4 is a cross-sectional view of the foldable display device of FIG. 3 in the folded state.

Referring to FIG. 3 and FIG. 4, a printed circuit board and a battery (not shown) are provided between the first and second supports 41 and 42 and the first and second bottom cases 212 and 222 to drive a flexible printed circuit (FPC).

As shown in FIG. 3, the flexible display panel 10 is in a substantially planar state when the foldable display device 100 is unfolded. In this case, the first and second bottom cases 212 and 222 installed in the installation portion 32 of the biaxial hinge member 30 and the first and second front cases 211 and 221 connected to the connection portion 33 are in a substantially planar state.

The first and second supports 41 and 42 rotate toward the flexible display panel 10 from the first and second front cases 211 and 221 by around the hinges 411 and 421, and the opposite ends of the first and second supports 41 and 42 support the flexible display panel 10 in the unfolded state with a support force reinforced by the control piece 34.

As shown in FIG. 4, when the foldable display device 100 is folded, the flexible display panel 10 is in a folded state. In this case, the first and second bottom cases 212 and 222 installed in the installation portion 32 of the biaxial hinge member 30 and the first and second front cases 211 and 221 connected to the connection portion 33 are in a folded state.

The first and second supports 41 and 42 rotate toward the first and second bottom cases 212 and 222 from the first and second front cases 211 and 221 around the hinges 411 and 421, and the opposite ends of the first and second supports 41 and 42 support the flexible display panel 10 while it is folded because the support force supplied by the control piece 34 of the biaxial hinge member 30 is weakened.

As described, by applying the biaxial hinge member 30, the curved portion 23 can stably support the flexible display panel 10 without being protruded toward the first and second bottom cases 212 and 222 when the foldable display device 100 is unfolded.

In addition, the flexible display panel 10 can be further stably supported by providing the first and second supports 41 and 42 in the first and second front cases 211 and 221 and the first and second bottom cases 212 and 222 connected to the biaxial hinge member 30.

Figure 5:
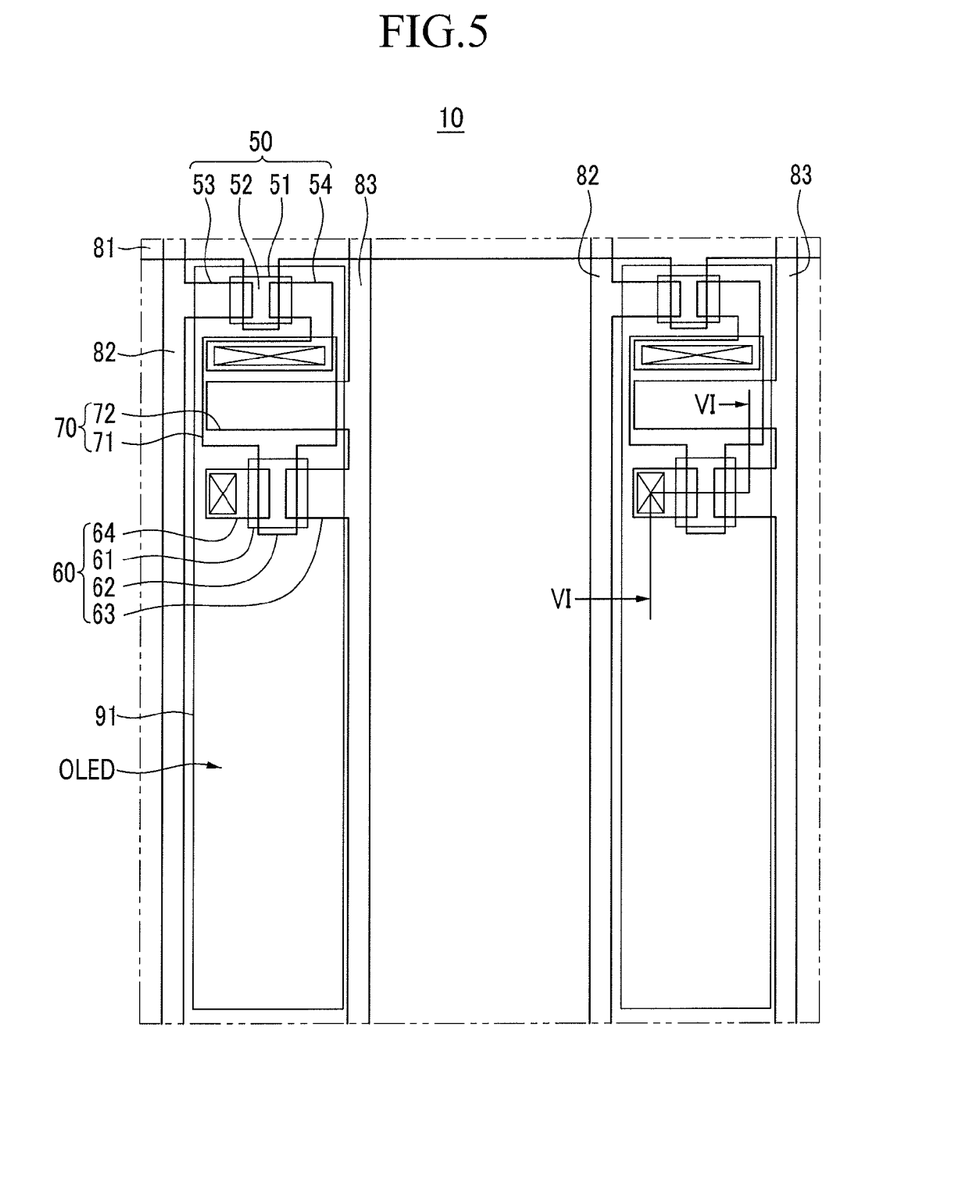
FIG. 5 is a layout view of a pixel structure of a flexible display panel of FIG. 1.
Figure 6:
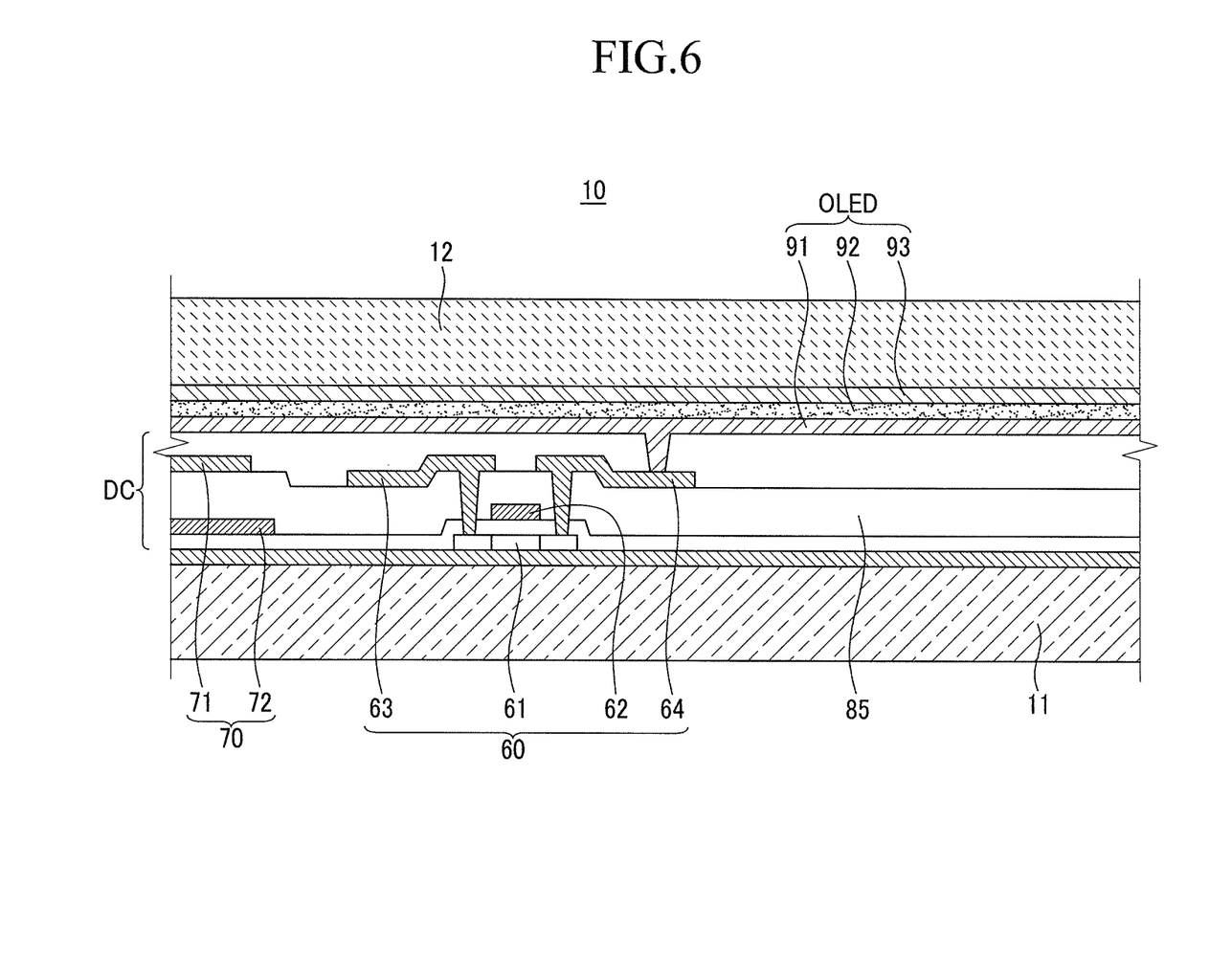
FIG. 6 is a cross-sectional view of the flexible display panel of FIG. 5, taken along the line VI-VI.

FIG. 5 is a layout view of a pixel structure of the flexible display panel of FIG. 1, and FIG. 6 is a cross-sectional view of the flexible display panel of FIG. 5, taken along the line VI-VI. The flexible display panel 10 is not limited to the structure described hereinafter, and may be formed of an OLED display or a flexible LCD having a different structure.

Referring to FIG. 5 and FIG. 6, the flexible display panel 10 includes a pixel circuit DC and an organic light-emitting diode OLED formed in each pixel. The pixel circuit DC includes a switching thin film transistor 50, a driving thin film transistor 60, and a capacitor 70. In addition, the flexible display panel 10 includes a gate line extended along one direction, a data line, and a common power line 83. The data line 82 and the common power line 83 cross the gate line 81 and are insulated from the gate line 81.

Here, one pixel may be defined by a boundary of the gate line 81, the data line 82, and the common power line 83, but is not necessarily limited thereto. The pixel is a basic unit that displays an image. The flexible display panel 10 displays an image using a plurality of pixels.

In FIG. 5, an active matrix flexible display panel 10 having a 2Tr-1Cap structure in which two thin film transistors 50 and 60 and one capacitor 70 are provided in one pixel is illustrated. However, the structure of the flexible display panel 10 is not limited to the illustrated example. The flexible display panel 10 may also include no less than three thin film transistors and no less than two capacitors. An additional wire may be further formed in the flexible display panel 10 so that the flexible display panel 10 may have various other structures.

The organic light-emitting diode OLED includes a pixel electrode 91, an organic emission layer 92, and a common electrode 93. One of the pixel electrode 91 and the common electrode 93 is a hole injection electrode and the other is an electron injection electrode. Light is emitted when electrons and holes are injected from the pixel electrode 91 and the common electrode 93 into the organic emission layer 92 and excitons in which the holes and the electrons are combined with each other return from an exited state to a ground state.

The pixel electrode 91 is formed of a metal having high reflectance and the common electrode 93 may be formed of a transparent conductive layer. In this case, light produced by the organic emission layer 92 is reflected by the pixel electrode 91 and transmitted through the common electrode 93 and an encapsulation substrate 12 to be emitted to the outside. In FIG. 6, reference numeral 11 denotes a flexible substrate.

The capacitor 70 includes a pair of capacitor electrodes 71 and 72 disposed with an interlayer insulating layer 85 as a dielectric material interposed therebetween. Capacitance is determined by charge stored in the capacitor 70 and a voltage between the two capacitor electrodes 71 and 72.

The switching thin film transistor 50 includes a switching semiconductor layer 51, a switching gate electrode 52, a switching source electrode 53, and a switching drain electrode 54. The driving thin film transistor 60 includes a driving semiconductor layer 61, a driving gate electrode 62, a driving source electrode 63, and a driving drain electrode 64.

The switching semiconductor layer 51 and the driving semiconductor layer 61 may be formed of a polysilicon or oxide semiconductor. The oxide semiconductor may include at least one of oxides based on titanium (Ti), hafnium (Hf), zirconium (Zr), aluminum (Al), tantalum (Ta), germanium (Ge), zinc (Zn), gallium (Ga), tin (Sn), or indium (In) and complex oxides thereof, such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-talaum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

The switching semiconductor layer 51 and the driving semiconductor layer 61 respectively include channel areas not doped with impurities, source areas, and drain areas. The source areas and the drain areas are respectively formed at both sides of the channel areas and doped with impurities. Here, the impurity used is dependent on the type of a thin film transistor, and may include an N-type impurity or a P-type impurity.

When the switching semiconductor layer 51 and the driving semiconductor layer 61 are formed of oxide semiconductors, an additional protection layer may be added to protect the oxide semiconductor from the external environment, e.g., a high temperature.

The switching thin film transistor 50 is used as a switch to select a pixel for light emission. The switching gate electrode 52 is connected to the gate line 81. The switching source electrode 53 is connected to the data line 82, and the switching drain electrode 54 is connected to one capacitor electrode 71.

The driving thin film transistor 60 applies a driving power for light emission of an organic emission layer 92 of the selected pixel to the pixel electrode 91. The driving gate electrode 62 is connected with the capacitor electrode 71 connected with the switching drain electrode 54. The driving source electrode 63 and the other capacitor electrode 72 are connected with the common power line 83. The driving drain electrode 64 is connected with the pixel electrode 91 of the organic light-emitting diode OLED through a contact hole.

The switching thin film transistor 50 is driven by a gate voltage applied to the gate line 81 to transmit a data voltage applied to the data line 82 to the driving thin film transistor 60. A voltage corresponding to a difference between a common voltage applied to the driving thin film transistor 60 from the common power line 83 and the data voltage transmitted from the switching thin film transistor 50 is stored in the capacitor 70, and a current corresponding to the voltage stored in the capacitor 70 flows to the organic light-emitting diode OLED through the driving thin film transistor 60 such that the organic emission layer 92 emits light.

The organic emission layer 92 may be formed of a low polymer organic material or a high polymer organic material such as poly3,4-ethylene dioxythiophene (PEDOT). In addition, the organic emission layer 92 may be formed as a multilayer including at least one of an emission layer, a hole injection layer (HIL), a hole transporting layer (HTL), an electron transporting layer (ETL), and an electron injection layer (EIL). When the multilayer includes all of the emission layers HIL, HTL, ETL, and EIL, the HIL is disposed on the pixel electrode 91, which is a positive electrode, and the HTL, the emission layer, the ETL, and the EIL are sequentially stacked thereon.

The organic emission layer 92 may include a red color organic emission layer emitting light of a red color, a green organic emission layer emitting light of a green color, and a blue organic emission layer emitting light of a blue color, and the red, green, and blue organic emission layers are respectively formed in red, green, and blue color pixels to realize a colored image.

In addition, the organic emission layer OL may layer the red, green, and blue organic emission layers together in the red, green, and blue color pixels, and red, green, and blue color filters may be provided in the respective pixels to realize a colored image. Alternatively, a white organic emission layer emitting light of a white color may be formed in each of the red, green, and blue pixels, and red, green, and blue color filters may be provided in the respective pixels to realize a colored image. When a colored image is realized using the white organic emission layer and color filters, deposition masks for deposition of the red, green, and blue organic emission layers to the respective pixels, are not needed.

The white organic emission layer that is described in another example may be formed in one organic emission layer and includes a configuration that may emit white by stacking a plurality of organic emission layers. For example, the white organic emission layer may include a configuration that may emit white by combining at least one yellow organic emission layer and at least one blue organic emission layer, a configuration that may emit white by combining at least one cyan organic emission layer and at least one red organic emission layer, and a configuration that may emit white by combining at least one magenta organic emission layer and at least one green organic emission layer.

Hereinafter, a second exemplary embodiment will be described. Descriptions of the same configurations as in the first exemplary embodiment and will be omitted in the second exemplary embodiment, and only the differences when compared to the first exemplary embodiment will be described in detail.

Figure 7:
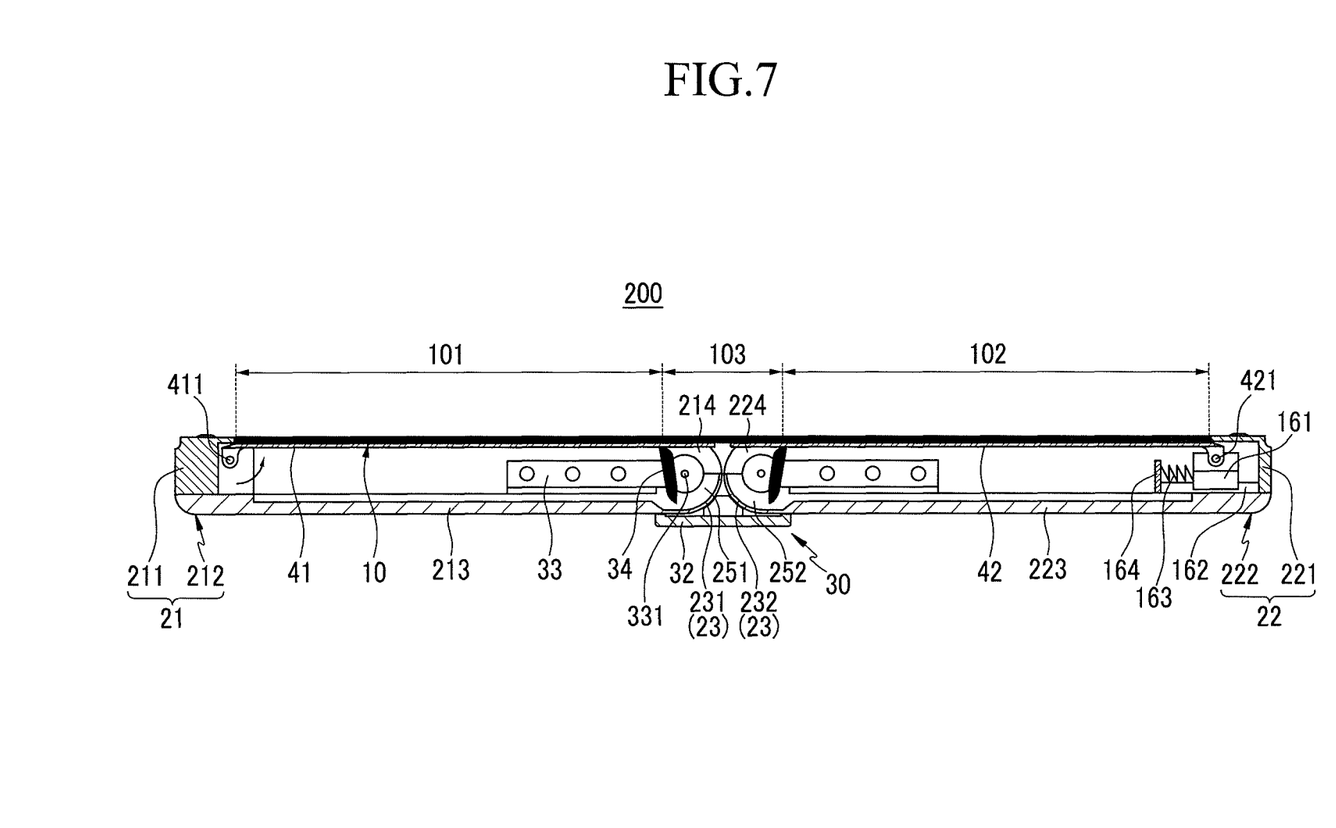
FIG. 7 is a cross-sectional view of a foldable display device according to a second exemplary embodiment.
Figure 8:
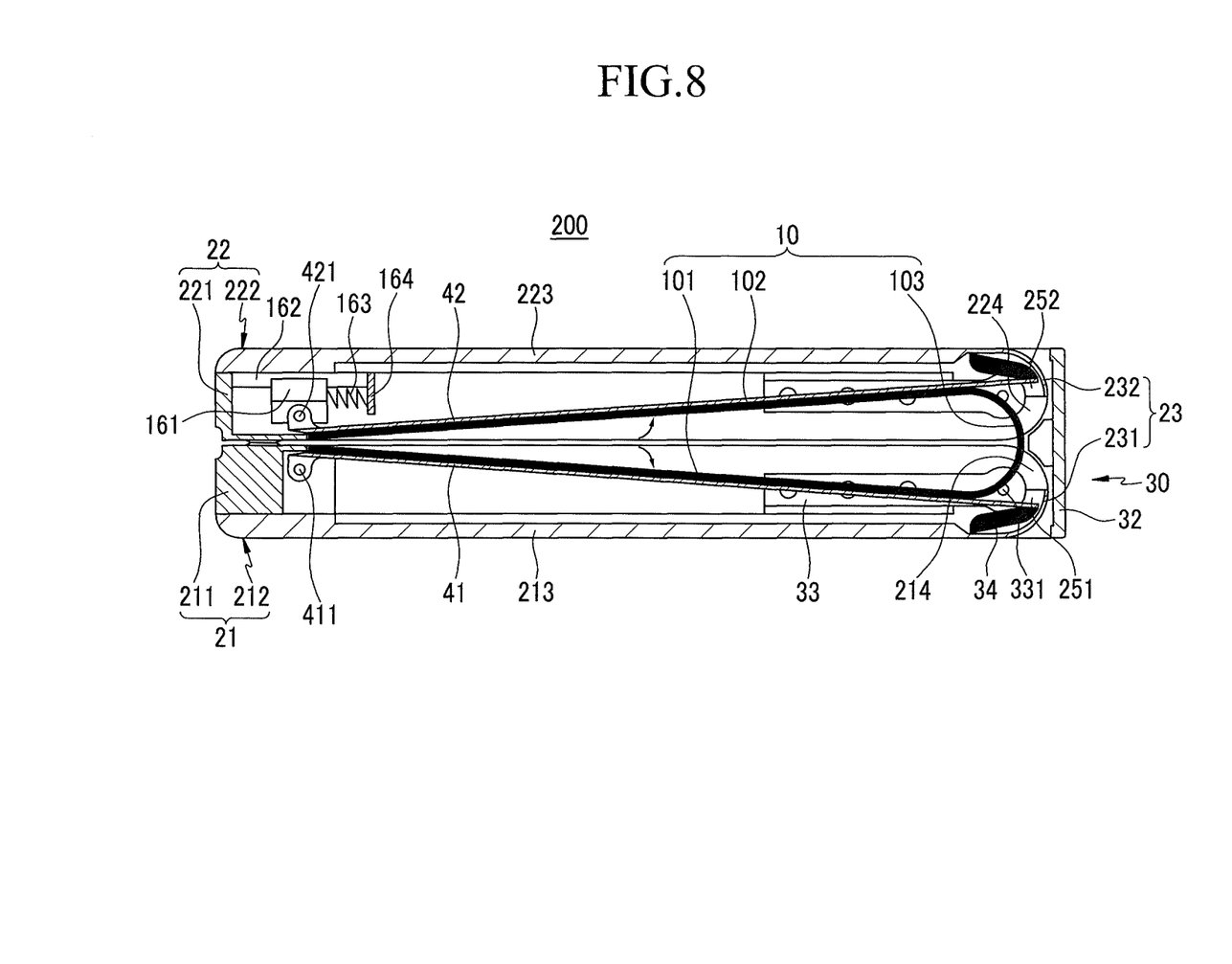
FIG. 8 is a cross-sectional view of the foldable display device of FIG. 7 in a folded state.

FIG. 7 is a cross-sectional view of a foldable display device according to the second exemplary embodiment. FIG. 8 is a cross-sectional view of the foldable display device of FIG. 7 in a folded state. Referring to FIG. 7 and FIG. 8, a foldable display device 200 according to the second exemplary embodiment is formed by mounting a first support 41 and a second support 42 to respective parts of a case 20 having a different structure.

For example, the first support 41 is rotatably mounted to a first front case 211 with a hinge 411 and the second support 42 is slidably mounted to a second bottom case 222 by providing a sliding member 161 therebetween. In addition, the second support 42 is rotatably mounted to the sliding member 161 with a hinge 421.

In further detail, the second bottom case 222 is provided with a rail 162 and the sliding member 161 is coupled to the rail 162 and then connected to an actuator 163. Thus, the sliding member 161 enables the second support 42 to slide on the rail 162 according to operation of the actuator 163.

The second bottom case 222 is provided with a support portion 164 protruding from a plane area 102. For example, the actuator 163 is provided as a spring member or a magnet (not shown) inserted between the sliding member 161 and the support portion 164. The spring member pushes the sliding member 161 to the outer edge of the second bottom case 222 by using the elastic force of the spring member.

Thus, when the foldable display device 200 is unfolded, the first and second supports 41 and 42 support the plane areas 101 and 102 of a flexible display panel 10 while respectively rotating with respect to the hinges 411 and 421. In addition, due to the elastic force of the spring member, the sliding member 161 moves to the outer edge of the second bottom case 222 along the rail 162. That is, the second support 42 connected to the sliding member 161 stably supports the flexible display panel 10 in the plane area 102.

When the foldable display device 200 is being folded, the movement of the flexible display panel 10 may be limited due to the first and second supports 41 and 42, and accordingly, the flexible display panel 10 may be wrinkled the plane areas 101 and 102. For example, when the foldable display device 200 is being folded, the amount of rotation of the first and second supports 41 and 42 is smaller than the displacement of the flexible display panel 10, and thus the flexible display panel 10 may be wrinkled in the plane areas 101 and 102. However, the second support 42 connected to the sliding member 161 slides to prevent the flexible display panel 10 from being wrinkled.

As described, according to at least one embodiment, the biaxial hinge member is installed in the bottom case in the folded area of the flexible display panel and the biaxial hinge member is connected to the rotation points of the front case and thus the flexible display panel can be stably supported with the case when the foldable display device is unfolded. Accordingly, the convenience of operation of the foldable display device for a user can be improved.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A foldable display device comprising:
a flexible display panel including a pair of lateral plane areas and a foldable area formed between the lateral plane areas; a pair of front cases surrounding a front perimeter of the flexible display panel, wherein each of the front cases has a rotation point about which the front cases at least partially rotate, wherein the rotation points are adjacent to the foldable area; a pair of bottom cases respectively coupled with the front cases to house the flexible display panel; and a biaxial hinge member formed at one of the front and bottom cases in the foldable area to connect the rotation points of the front cases to each other, wherein each of the bottom cases comprises a lateral plane portion corresponding to the plane areas and wherein the foldable display device further comprises a curved portion connecting the lateral plane portions in an area corresponding to the foldable area, wherein the curved portion comprises two half-curved portions respectively connected to the lateral plane portions and wherein the two half-curved portions are connected through a hinge portion and configured to be folded or unfolded.

2. The foldable display device of claim 1, wherein the biaxial hinge member comprises:
a body disposed in an outer side of the bottom case;
an installation portion formed in an inner side of the body and installed in the hinge portion; and
a connection portion coupled to a hole of the body by a hinge at a distance from the installation portion and connected to the front cases.

3. The foldable display device of claim 2, further comprising a pair of supports disposed between the flexible display panel and the bottom case in the plane areas and supporting the flexible display panel by being mounted to the front cases by a pair of hinges.

4. The foldable display device of claim 3, wherein the biaxial hinge member further comprises a control piece formed in one side of the connection portion in an inner side of the body to attach the supports to the flexible display panel.

5. The foldable display device of claim 4, wherein the two half-curved portions comprise first curved protrusion portions protruding from ends of the two half-curved portions to house the control piece.

6. The foldable display device of claim 5, wherein the front cases further comprise second curved protrusion portions protruding from ends of the front cases corresponding to the first curved protrusion portions to house the first curved protrusion portions and the control piece.

7. The foldable display device of claim 6, wherein the first and second curved protrusion portions are formed on the inside of the external sides of the front and bottom cases and are recessed by at least the sum of the thickness of the body and the thickness of the connection portion.

8. The foldable display device of claim 2, further comprising a first support and a second support provided between the flexible display panel and the bottom case to support the flexible display panel in the plane areas.

9. The foldable display device of claim 8, wherein the first support is mounted to a first front case of the front cases with a first hinge, and wherein the second support is mounted to a sliding member with a second hinge by providing the sliding member to a second bottom case of the bottom cases.

10. The foldable display device of claim 9, where the second bottom case comprises a rail configured to guide movement of the sliding member and wherein the sliding member is coupled to the rail and connected to an actuator.

11. The foldable display device of claim 10, wherein the second bottom case comprises a support protruding from the second bottom case, and wherein the actuator is formed as a spring member inserted between the sliding member and the support portion.

12. A foldable display device comprising:
a flexible display panel including a pair of lateral plane areas and a foldable area formed between the lateral plane areas; a case housing the flexible display panel, wherein the case has a pair of rotation points about which the case at least partially rotates and wherein the rotation points are adjacent to the foldable area;
a biaxial hinge member connecting the rotation points of the case to each other; and
a support disposed in the case in the plane areas to support the flexible display panel, wherein the support is mounted to the case by a hinge, and wherein the biaxial hinge member comprises a control piece supporting an end of the support opposite the hinge in the foldable area to attach the support to the flexible display panel.

13. The foldable display device of claim 12, wherein the case comprises first and second sides opposing each other, wherein the support comprises a first support and a second support that support the flexible display panel, wherein the first support is mounted to the first side of the case with a hinge, and wherein the second support is mounted to a sliding member with a hinge by providing the sliding member in the second side of the case.

14. A foldable display device comprising:
a flexible display panel including a pair of lateral plane areas and a foldable area formed between the lateral plane areas; a case housing the flexible display panel, wherein the case has a pair of rotation points about which the case at least partially rotates and
wherein the rotation points are adjacent to the foldable area; and
a biaxial hinge member connecting the rotation points of the case to each other, wherein the case comprises: a bottom case including a pair of lateral plane portions corresponding to the plane areas; and a pair of half-curved portions respectively connected to the lateral plane portions, wherein the half-curved portions are connected through a hinge portion and configured to be folded or unfolded.

15. The foldable display device of claim 14, further comprising:
a support disposed in the case in the plane areas to support the flexible display panel by being mounted to the case by a hinge.

16. The foldable display device of claim 15, wherein the biaxial hinge member comprises a control piece supporting an end of the support opposite the hinge in the foldable area to attach the support to the flexible display panel.

17. The foldable display device of claim 14, wherein the biaxial hinge member comprises:
a body located in an outer side of the bottom case;
an installation portion formed in an inner side of the body and installed in the hinge portion; and
a connection portion coupled to a hole of the body by a hinge at a distance from the installation portion.

* * * * *